(12) United States Patent
Vankayala

(10) Patent No.: US 9,329,623 B2
(45) Date of Patent: May 3, 2016

(54) APPARATUSES, INTEGRATED CIRCUITS, AND METHODS FOR SYNCHRONIZING DATA SIGNALS WITH A COMMAND SIGNAL

(75) Inventor: Vijayakrishna J. Vankayala, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 13/592,244

(22) Filed: Aug. 22, 2012

(65) Prior Publication Data

US 2014/0055184 A1  Feb. 27, 2014

(51) Int. Cl.
*H03D 3/24* (2006.01)
*G06F 1/12* (2006.01)
*H03L 7/099* (2006.01)
*H03L 7/16* (2006.01)
*H03L 7/093* (2006.01)

(52) U.S. Cl.
CPC ............... *G06F 1/12* (2013.01); *H03L 7/0992* (2013.01); *H03L 7/16* (2013.01); *H03L 7/093* (2013.01)

(58) Field of Classification Search
CPC ..... H04L 7/033; H04L 7/0337; H04L 7/0331; H04L 7/0338; H03L 7/0814
USPC ......... 375/219–220, 224–228, 242–254, 259, 375/285–294, 316, 346, 349–351, 353–376
See application file for complete search history.

(56) References Cited

U.S. PATENT DOCUMENTS

| | | | |
|---|---|---|---|
| 5,004,933 A | 4/1991 | Widener | |
| 6,111,810 A | 8/2000 | Fujita | |
| 6,219,384 B1 | 4/2001 | Kliza et al. | |
| 6,260,128 B1 | 7/2001 | Ohshima et al. | |
| 6,275,077 B1 | 8/2001 | Tobin et al. | |
| 6,424,592 B1 | 7/2002 | Maruyama | |
| 6,438,055 B1 | 8/2002 | Taguchi et al. | |
| 6,459,313 B1 | 10/2002 | Godbee et al. | |
| 6,489,823 B2 | 12/2002 | Iwamoto | |
| 6,510,095 B1 | 1/2003 | Matsuzaki et al. | |
| 6,636,110 B1 | 10/2003 | Ooishi et al. | |
| 6,687,185 B1 | 2/2004 | Keeth et al. | |
| 6,710,726 B2 | 3/2004 | Kim et al. | |
| 6,744,285 B2 | 6/2004 | Mangum et al. | |
| 6,781,861 B2 | 8/2004 | Gomm et al. | |
| 6,839,288 B1 | 1/2005 | Kim et al. | |
| 6,861,901 B2 | 3/2005 | Prexl et al. | |
| 6,914,798 B2 | 7/2005 | Kwon et al. | |

(Continued)

OTHER PUBLICATIONS

Related U.S. Appl. No. 13/074,972, filed Mar. 29, 2011.

(Continued)

*Primary Examiner* — James M Perez

(74) *Attorney, Agent, or Firm* — Dorsey & Whitney LLP

(57) ABSTRACT

Apparatuses, integrated circuits, and methods are disclosed for synchronizing data signals with a command signal. In one such example apparatus, an input control circuit is configured to provide an input clock signal responsive to a data clock signal. A delay circuit is configured to delay the data clock signal corresponding to a propagation delay of a command signal. An output control circuit is configured to provide an output clock signal responsive to the delayed data clock signal and a buffer circuit is configured to capture data responsive to the input clock signal, with the buffer circuit further configured to provide the captured data responsive to the output clock signal.

30 Claims, 5 Drawing Sheets

(56) References Cited

U.S. PATENT DOCUMENTS

| | | |
|---|---|---|
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,788,896 B2 | 7/2014 | Tekumalla |
| 9,001,955 B2 | 4/2015 | Lamanna et al. |
| 9,166,579 B2 | 10/2015 | Huber et al. |
| 2001/0015924 A1 | 8/2001 | Arimoto et al. |
| 2002/0057624 A1 | 5/2002 | Manning |
| 2003/0117864 A1 | 6/2003 | Hampel et al. |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0137471 A1 | 6/2008 | Schnell et al. |
| 2008/0144423 A1 | 6/2008 | Kwak |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0232213 A1 | 9/2010 | Hwang et al. |
| 2010/0254198 A1* | 10/2010 | Bringivijayaraghavan et al. ............ 365/189.05 |
| 2011/0047319 A1 | 2/2011 | Jeon et al. |
| 2011/0055671 A1 | 3/2011 | Kim et al. |
| 2011/0102039 A1 | 5/2011 | Shin |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1* | 4/2012 | Flores et al. .................. 713/300 |
| 2012/0124317 A1 | 5/2012 | Mirichigni et al. |
| 2012/0212268 A1 | 8/2012 | Kim |
| 2012/0274376 A1 | 11/2012 | Gomm et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder at al, |
| 2014/0010025 A1 | 1/2014 | Bringivijayaraghavan |
| 2014/0035640 A1 | 2/2014 | Kwak et al. |
| 2014/0055184 A1* | 2/2014 | Vankayala .................... 327/161 |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0258764 A1 | 9/2014 | Kwak |
| 2015/0170725 A1 | 6/2015 | Kwak |
| 2015/0235691 A1 | 8/2015 | Kwak |

OTHER PUBLICATIONS

Related U.S. Appl. No. 13/093,640, filed Apr. 25, 2011.
Related U.S. Appl. No. 13/364,198, filed Feb. 1, 2012.
Related U.S. Appl. No. 13/486,674, filed Jun. 1, 2012.
Related U.S. Appl. No. 13/531,341, filed Jun. 22, 2012.
Related U.S. Appl. No. 13/543,698, filed Jul. 6, 2012.
Notificiation of International Search Report and Written Opinion dated May 7, 2012 for International Application No. PCT/US2012/027672, May 7, 2012, 1-9.
"Interfacing DDR SDRAM with Stratix II Devices", Version 3.2, Altera Corp, Sep. 2008.
Lee, "How to Implement DDR SGRAM in Graphic System", Samsung Electric, 1998.
Office Action received for KR Appln No. 10-2013-7027649, dated Jan. 30, 2015.

* cited by examiner

United States Patent US 9,329,623 B2

APPARATUSES, INTEGRATED CIRCUITS, AND METHODS FOR SYNCHRONIZING DATA SIGNALS WITH A COMMAND SIGNAL

TECHNICAL FIELD

Embodiments of the invention relate generally to integrated circuits, and more particularly, in one or more of the illustrated embodiments, to synchronizing data signals with a command signal.

BACKGROUND OF THE INVENTION

As operating frequencies of integrated circuits increase, propagation delays resulting from relatively long signal paths can set up challenging timing issues. In some cases, the delay of a signal propagating from one location of an integrated circuit to another location may be greater than one or more clock periods. For example, the propagation delay from the physical center of an integrated circuit to an outer edge of the integrated circuit may be 4 ns, whereas the clock period may be only 1 ns for integrated circuits operated at 1 GHz. Signals may be provided to the integrated circuit at different physical locations on the integrated circuit due to the relatively large number of input nodes required and the relatively large size of input pads, pins, or other input nodes. In order to efficiently capture the signals provided to the integrated circuit at different physical locations, each signal or set of signals may be captured with a separate clock signal).

Notwithstanding the different physical locations at which signals are provided to an integrated circuit and the different propagation delays among such signals, the signals may need to be combined or otherwise act together within the integrated circuit. As one example, in a memory circuit, a command signal may be provided near the physical middle of the circuit, and a set of data signals may be provided along the physical top or bottom edge of the circuit. A write circuit may receive both the command signal and the set of data signals, and in response may write the data contained in the set of data signals to the memory array. However, if the propagation delay from the command signal input to the write circuit is different than the propagation delay from the data signals input to the write circuit, the timing of one or both of the command signal and/or the set of data signals may need to be altered so that the write circuit can synchronously provide the data with the correct command.

When synchronizing the timing for two different signals, typically a delay circuit is used on the shorter signal path and its corresponding clock path, with the delays mimicking the extra propagation delay of the longer signal path. Continuing with the example above, if the path to the write circuit is much longer for the command signal than it is for the set of data signals, a delay circuit may be used to delay the set of data signals and the corresponding clock for the data signals, relative to the command signal or the command signal's corresponding system clock. Such delay circuits can, however, consume significant amounts of power, occupy large amounts of area (particularly if delay circuits are needed for each of dozens of data signals), and be imprecise due to temperature and other variations.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
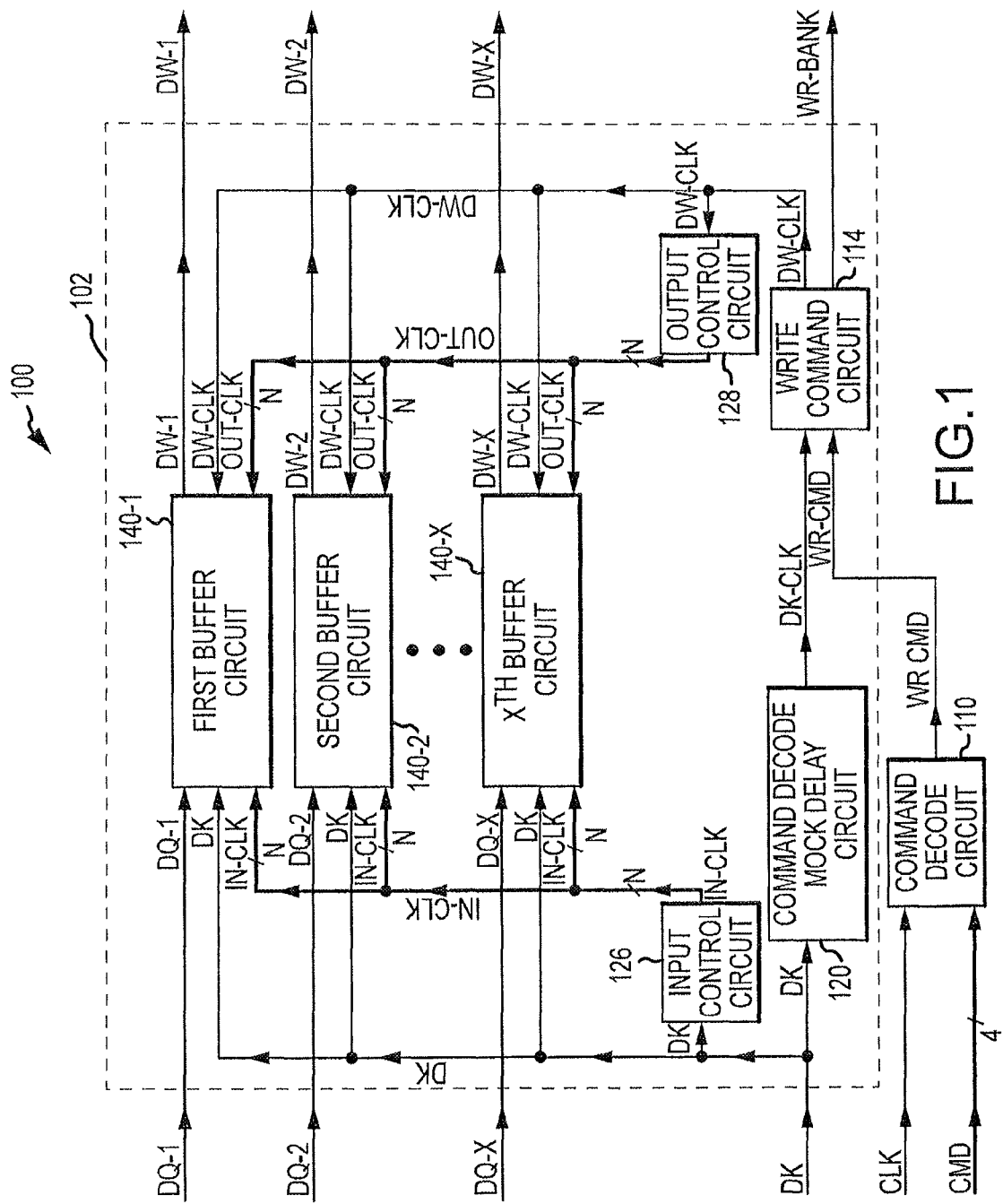
FIG. 1 is a block diagram of an apparatus including a write circuit according to an embodiment of the present invention.

FIG. 1 illustrates an apparatus, for example, a portion of an integrated circuit 100, that includes a write circuit 102 and a command decode circuit 110. The write circuit 102 may physically be located away from the command decode circuit 110. For example, the write circuit 102 may physically be located near an edge of the integrated circuit 100, whereas the command decode circuit 110 may physically be located near the center of the integrated circuit 100. Due to the travel-time delay caused by the physical distance between the command decode circuit 110 and the write circuit 102 (and also due to other delays, such as processing delays in the command decode circuit 110), signals provided from (e.g., generated in, outputted from, etc.) the command decode circuit 110 to the write circuit 102, such as the write command signal WR-CMD, may need to be synchronized with other signals provided to (e.g., inputted to, coupled to, etc.) the write circuit 102, such as one or more data input signals DQ when these signals are subsequently output from the write circuit 102. The signals provided to the write circuit 102 may have been generated in the write circuit, circuit, outputted from a different circuit or component to the write circuit, and so forth.

The write circuit 102 includes one or more buffer circuits 140, an input control circuit 126, an output control circuit 128, a command decode mock delay circuit 120, and a write command circuit 114. One or more data input signals DQ-1, DQ-2 . . . DQ-X, a data clock signal DK (e.g., a continuous clock signal or a non-continuous clock signal, such as a strobe signal), and a write command signal WR-CMD are provided to the write circuit 102. In response, the write circuit 102 provides (e.g., generates, outputs, etc.) one or more data output signals DW-1, DW-2 . . . DW-X and a write bank signal WR-BANK, with the data output signals DW-1, DW-2 . . . DW-X and the write bank signal WR-BANK in phase with each other.

A system clock signal CLK and a command signal bus CMD are provided to the command decode circuit 110, which in response provides, among other things the write command signal WR-CMD to the write circuit 102. The system clock signal CLK and the data clock signal DK may in some embodiments have the same frequency, although in other cases CLK and DK may have different frequencies. In any event, the system clock signal CLK may be provided to the integrated circuit 100 at an input node near the input node for the command signal bus CMD in order for the system clock signal CLK to efficiently capture commands on the command signal bus CMD. Similarly, the data clock signal DK may be provided to the integrated circuit 100 at an input node near the input node for the data input signal lines DQ in order for the data clock signal DK to efficiently capture data on the data input signal lines DQ. As used herein, capturing data includes latching data, clocking data, capturing data in another manner, and so forth.

Returning to the write circuit 102, the command decode mock delay circuit 120 provides a delayed data clock signal DK-CLK in response to the data clock signal DK. The command decode mock delay circuit 120 may include one more metal lines, capacitances, gates, and so forth, and may mimic the propagation delay of a command such as a write command from the time it is provided to the command decode circuit 110 until the time it is provided to the write command circuit 114. Such propagation delay may include the processing delay incurred in decoding the command in the command decode circuit 110 and the travel-time delay for the path from the output of the command decode circuit 110 to the input of the write command circuit 114. In this manner, the command decode mock delay circuit 120 provides the delayed data clock signal DK-CLK corresponding to the length of the propagation delay of the write command signal WR-CMD.

The delayed data clock signal DK-CLK and the decoded write command signal WR-CMD are provided to the write command circuit 114, which captures (e.g., latches, clocks) the write command with the delayed data clock signal DK-CLK. The write command circuit 114 also provides a data write clock signal DW-CLK and a write bank signal WR-BANK responsive to the delayed data clock signal DK-CLK and/or responsive to the write command signal WR-CMD. As explained in more detail below, the write command circuit 114 may provide additional or alternative clock signals, such as a clock signal that is slightly earlier than the data write clock signal DW-CLK. Because the delayed data clock signal DK-CLK propagates through at least a portion of the actual write command circuit 114, there may be no need to mimic the propagation delay through the write command circuit 114 in some embodiments in generating the output clock signals OUT-CLK that are described in more detail below.

In order to help synchronize the data output from the write circuit 102 with the write bank signal WR-BANK, one or more buffer circuits 140 may be provided within the write circuit 102. The write circuit 102 may include any number X of buffer circuits 140. The number X of buffer circuits may be the same as the number of input lines DQ. In some embodiments, the buffer circuits 140 may not include any mock delay circuits, but instead may be configured to capture data (such as the data provided in the data input signals DQ-1, DQ-2 DQ-X) in response to one clock signal and provide the captured data in response to a second clock signal that is based at least in part on the propagation delay of the delayed clock signal DK-CLK and/or the write command WR-CMD.

A respective data input signal DQ-1, DQ-2 . . . DQ-X is provided to each of the respective buffer circuits 140-1, 140-2 . . . 140-X, as is the data clock signal DK and an input clock signal IN-CLK that is generated in an input control circuit 126 responsive to the data clock signal DK. The input control circuit 126 may in some embodiments split the data clock signal DK such that the input clock signal IN-CLK includes several different phases, as explained in more detail below with reference to FIG. 2. In other embodiments, however, the input control circuit may not split the data clock signal DK and may provide the data clock signal DK as the input clock signal IN-CLK. In still other embodiments, the data clock signal DK may be provided directly to each of the buffer circuits 140-1, 140-2 . . . 140-X.

Figure 4:
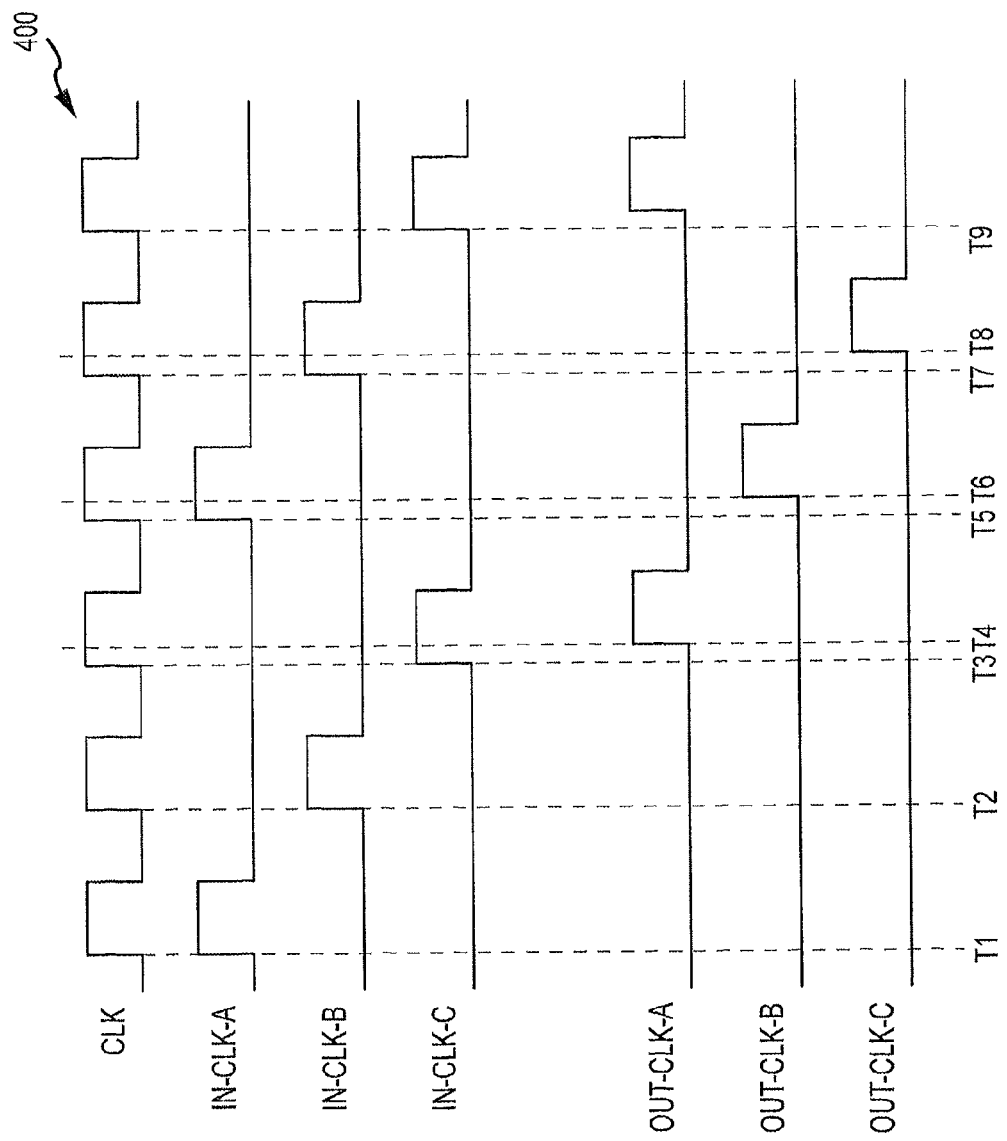
FIG. 4 is a timing diagram for the buffer circuit of FIG. 2 according to an embodiment of the invention.

The input control circuit 126 may be a counter, a phase splitter, a frequency divider, and so forth. In embodiments where the input control circuit 126 is a counter, it may be a ring counter, a one-hot counter, and so forth. With reference to FIG. 4, a one-hot counter 126 may provide one or more one-hot input clock signals IN-CLK that each have clock pulses that share a common pulse width as the system clock CLK and/or the data input clock signal DK but that, in some embodiments, are asserted as logic high less frequently than the input clock signal DK. For example, in embodiments with three dual clocked storage circuits 250 (explained in more detail below), the input control circuit 126 may provide three one-hot input clock signals IN-CLK-A, IN-CLK-B, IN-CLK-C that each have a positive pulse width similar to that of the system clock CLK and/or the data input clock signal DK, but that have much longer zero pulse width compared to the system clock CLK and/or the data input clock signal DK, as shown for example in FIG. 4. In general, the input control circuit 126 may provide any number of control signals, such as the input clock signal(s) IN-CLK described above.

The output control circuit 128 may be similar to the input control circuit 126, except that the output control circuit may provide one or more output clock signals OUT-CLK responsive to the data write clock signal DW-CLK, which is in turn responsive to the delayed data clock signal DK-CLK and/or responsive to the write command signal WR-CMD.

Figure 2:
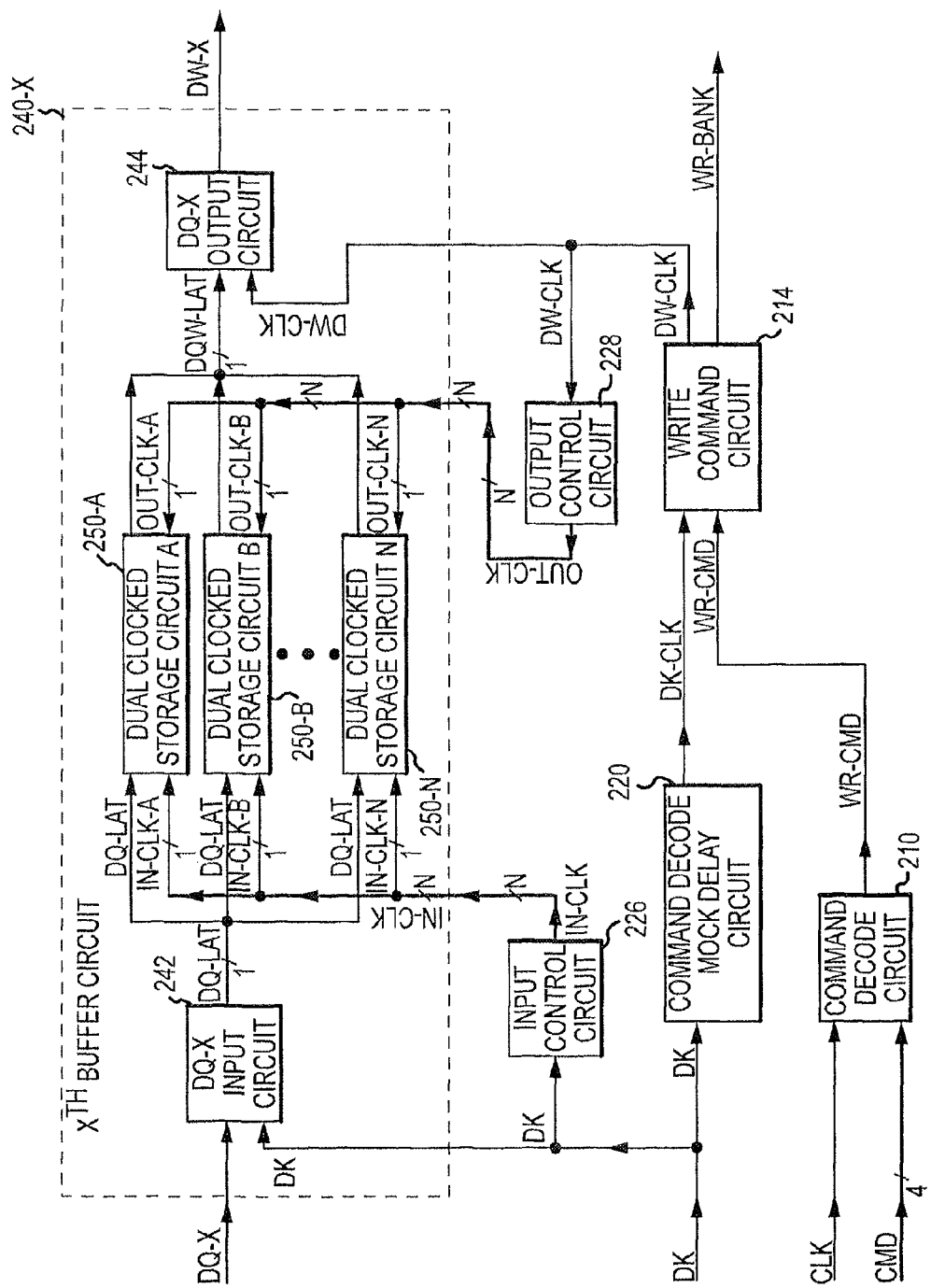
FIG. 2 is a block diagram of a buffer circuit according to an embodiment of the invention.

With reference now to FIG. 2, a buffer circuit 240-X according to an embodiment of the present invention is shown. As mentioned above, the buffer circuit 240-X receives a data input signal DQ-X, the data clock signal DK, the input clock signal IN-CLK from the input control circuit 226, the output clock signal OUT-CLK from the output control circuit 228, and the data write clock signal DW-CLK from the write command circuit 214. The buffer circuit 240-X provides a data output signal DW-X that may be provided synchronously with the write bank signal WR-BANK to a memory array or other circuit.

The buffer circuit 240-X illustrated in FIG. 2 includes a DQ-X input circuit 242, one or more dual clocked storage circuits 250, and a DQ-X output circuit 244. In operation, the DQ-X input circuit 242 latches the data input signal DQ-X with the data clock signal DK, and provides a latched data signal DQ-LAT in response. The latched data signal DQ-LAT is provided to the one or more dual clocked storage circuits 250 along with the input clock signal IN-CLK.

With reference to FIG. 2, each of the buffer circuits 240 may include any number N of dual clocked storage circuits 250. In some embodiments, only one dual clocked storage circuit 250-A is needed. Each dual clocked storage circuit 250 may act as a clock domain change buffer in some embodiments. In embodiments where the data clock signal DK continuously transitions, the buffer circuits 240 and/or the dual clocked storage circuits 250 may continuously (e.g., constantly) store and output data responsive to the continuously transitioning data clock signal DK.

As explained in more detail below with reference to FIG. 3, some embodiments of the dual clocked storage circuit(s) may include an input stage and an output stage, which together store a single piece of data. In other embodiments, the dual clocked storage circuit(s) may be structured as a first-in-first-out (FIFO) buffer circuit, which may be able to buffer any number of pieces of data.

In operation, the latched data signal DQ-LAT from the DQ-X input circuit 242 may be provided to the input of each of the dual clocked storage circuits 250. Furthermore, at least one of the input clock signals IN-CLK may be provided to each the dual clocked storage circuits 250. For example, in embodiments with three dual clocked storage circuits 250-A, 250-B, 250-C, three respective input clock signals IN-CLK-A, IN-CLK-B, IN-CLK-C may be provided to the respective dual clocked storage circuits 250-A, 250-B, 250-C. The respective input clock signals IN-CLK-A, IN-CLK-B, IN-CLK-C may be in phase with the latched data signal DQ-LAT.

The outputs of the dual clocked storage circuits 250 may be coupled together to a DQW-LAT node in some embodiments, and data may be output from the dual clocked storage circuits 250 responsive to the output clock signals OUT-CLK that are provided to each of the respective dual clocked storage circuits 250. In the example described above, similar to the input clock signals IN-CLK-A, IN-CLK-B, IN-CLK-C, the three dual clocked storage elements 250-A, 250-B, 250-C each receive a respective output clock signal OUT-CLK-A, OUT-CLK-B, OUT-CLK-C, and each provide the captured data responsive to the respective output clock signal OUT-CLK.

The output node DQW-LAT of the dual clocked storage circuits 250 may be provided to the DQ-X output circuit 244, which in turn latches the output of the dual clocked storage circuits 250 with the data write clock signal DW-CLK.

The data write clock signal DW-CLK may be provided from the write command circuit 214 at some time before the write command circuit 214 provides the corresponding write bank signal WR-BANK. For example, the data write clock signal DW-CLK may be provided from the write command circuit 214 early enough to compensate for the time it takes for DW-CLK to propagate through the output control circuit 228, the time it takes the output control circuit 228 to generate the output clock signal(s) OUT-CLK, the time it takes for the dual clocked storage circuit(s) 250 to output the captured data, and for the time it takes the outputted data to propagate through the DQ-X output circuit 244. In this manner, the data output signal DW-X may be in phase with the write bank signal WR-BANK.

Additionally, there may be some delay on the data write clock signal DW-CLK line after the data write clock signal DW-CLK is provided to the output control circuit 228 but before it is provided to the DQ-X output circuit 228 in some embodiments. For example, the delay may be enough to compensate for the time it takes for DW-CLK to propagate through the output control circuit 228, for the time it takes the output control circuit 228 to generate the output clock signal(s) OUT-CLK, and the time it takes for the dual clocked storage circuit(s) 250 to output the captured data. The delay on the data write clock signal DW-CLK line may be induced due to a travel path of the line, capacitances, gates, and so forth. In this manner, the data write clock signal DW-CLK may be in phase with the data on the DQW-LAT node.

Although FIG. 2 illustrates a single data write clock signal DW-CLK provided from the write command circuit 214, in some embodiments multiple, separate clock signals are provided from the write command circuit 214 to the output control circuit 228, the DQ-X output circuit 244, and to any latches, gates, etc. within the write command circuit 214 itself (such as a final latch that provides the write bank signal WR-BANK). In those embodiments of the write command circuit 214 that include a final latch, the clock signal provided to that final latch may be the same as the data write clock signal provided to the DQ-X output circuit.

Figure 3:
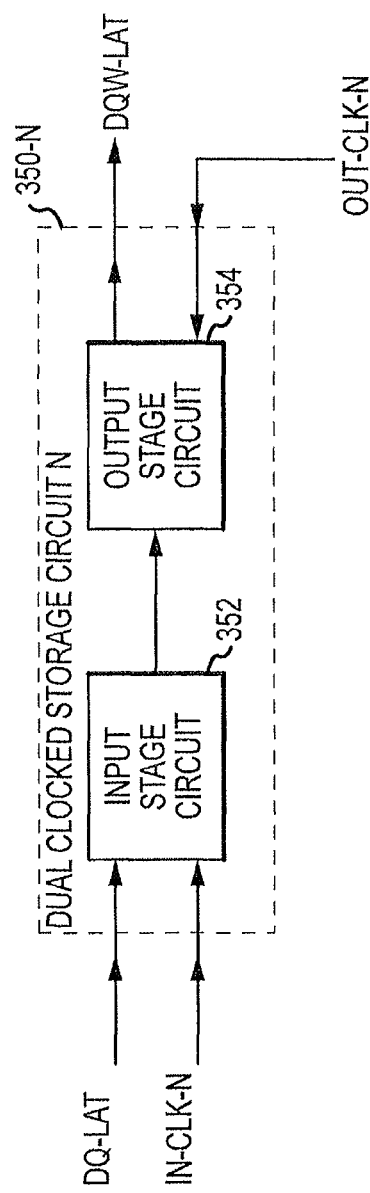
FIG. 3 is a block diagram of a dual clocked storage circuit according to an embodiment of the invention.

With reference now to FIG. 3, one example of a dual clocked storage circuit 350-N according to an embodiment of the present invention is illustrated. An input stage circuit 352 may receive and latch the (previously latched) data signal DQ-LAT with one of the input clock signals IN-CLK-N. The output of the input stage 352 is provided to the input of the output stage 354, which receives one of the output clock signals OUT-CLK-N and provides in response the DQW-LAT signal.

Each of the input and output stages 352, 354 may be registers, level sensitive latches, flip-flops, tri-state devices, and so forth, and the input stage 352 may be serially coupled to the output stage 354 as illustrated in FIG. 3.

As described in more detail below, in operation, data from the DQ-LAT signal is latched in the input stage circuit 352 responsive to the input clock signal IN-CLK-N. The data latched in the input stage 352 drives the output stage 354, which in turn outputs the latched data responsive to the output clock signal OUT-CLK-N. As such, the dual clocked storage circuit 350-N transitions once as data is latched and once as it is output, thus allowing a high frequency, low power operation as compared with delay-based approaches.

With reference now to the timing diagram 400 illustrated in FIG. 4 and with continuing reference to FIG. 2, the operation of the buffer circuit 240-X illustrated in FIG. 2 will now be described. At time T1, the input clock signal IN-CLK-A transitions to logic high and the latched data signal DQ-LAT is latched into the first dual clocked storage circuit 250-A. At time T2, the input clock signal IN-CLK-B transitions to logic high and the latched data signal DQ-LAT is latched into the first dual clocked storage circuit 250-B. At time T3, the input clock signal IN-CLK-C transitions to logic high and the latched data signal DQ-LAT is latched into the first dual clocked storage circuit 250-C.

At time T4, the output clock signal OUT-CLK-A transitions to logic high, and the captured data from the first dual clocked storage circuit 250-A is output to the DQW-LAT node, thereby allowing new data to be latched into the first dual clocked storage circuit 250-A at time T5. Similarly, at time T6, the output clock signal OUT-CLK-B transitions to logic high, and the captured data from the first dual clocked storage circuit 250-B is output to the DQW-LAT node, thereby allowing new data to be latched into the first dual clocked storage circuit 250-B at time T7. Also, at time T8, the output clock signal OUT-CLK-C transitions to logic high, and the captured data from the first dual clocked storage circuit 250-C is output to the DQW-LAT node, thereby allowing new data to be latched into the first dual clocked storage circuit 250-C at time T9.

Figure 5:
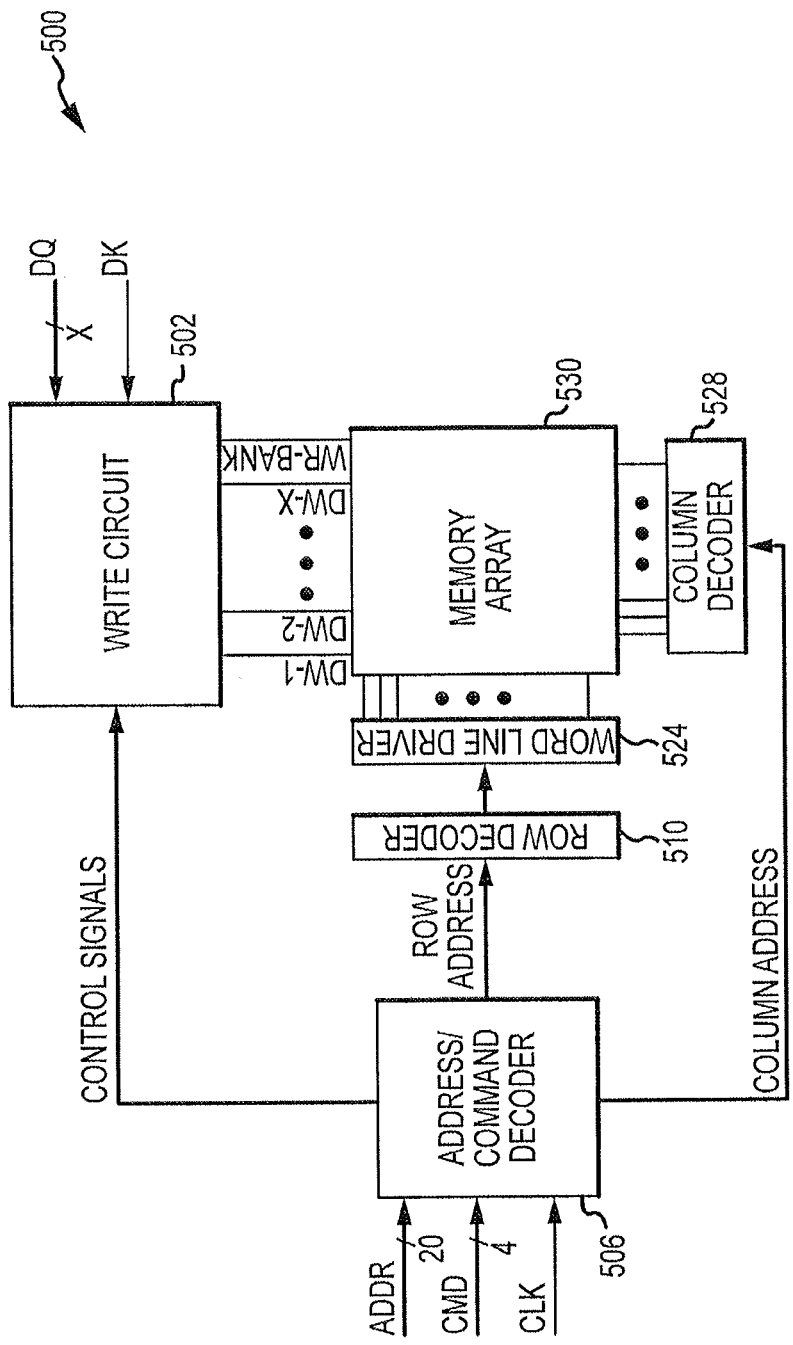
FIG. 5 is a block diagram of a memory according to an embodiment of the invention.

FIG. 5 illustrates a portion of a memory 500 according to an embodiment of the present invention. The memory 500 may be a reduced latency DRAM (RLDRAM) memory, a DRAM memory, an SRAM memory, or generally any type of memory or other integrated circuit that includes signals coming from different physical locations of the circuit at different propagation delays. The memory 500 includes an array 530 of memory cells, which may be, for example, DRAM memory cells or some other types of memory cells. The memory 500 includes an address/command decoder 506 that receives memory commands through a command bus CMD and addresses through an address bus ADDR. The address/command decoder 506 provides control signals, such as a write command, based on the commands received through the address and command buses. The address/command decoder 506 also provides row and column addresses to the memory 500 respectively through a row decoder 510 and a column decoder 528. The address/command decoder 506 responds to memory commands and addresses provided to the command and address buses to perform various operations on the memory array 530. In particular, the address/command decoder 506 is used to provide internal control signals to write data to the memory array 530, and also to read data from the memory array 530.

The column address decoder 528 selects bit lines extending through the array 520 corresponding to respective column addresses. The row address decoder 510 is connected to word line driver 524 that activates respective rows of memory cells in the array 530 corresponding to received row addresses.

Write data DQ are provided to the memory array 530 through a write circuit 502 (which may be similar to the write circuit 102 described above with reference to FIG. 1). For example write data DQ may be provided to the write circuit along with a corresponding write data clock DK. In order to write data into the memory array 530, the write data may need to be synchronized with a write command provided from the address/command decoder over the control signal bus. To this end, the write circuit may include one or more buffer circuits (not shown) similar to the buffer circuits 140, 240 described above with reference to FIGS. 1 and 2.

In some embodiments, the memory 500 may include a plurality of write circuits, for example one write circuit near the top edge of the memory and one write circuit near the bottom edge of the memory, with each write circuit receiving a respective plurality of write data and a respective write data clock.

Also, the write data clock DK may be continuously running in some embodiments, but in other embodiments the write data clock DK may be non-continuous, such as a write data strobe signal that is only logic high or logic low when there is data to be written by the write circuit 502.

From the foregoing it will be appreciated that, although specific embodiments of the invention have been described herein for purposes of illustration, various modifications may be made without deviating from the spirit and scope of the invention. For example, FIGS. 1 and 5 include embodiments 102, 502 of a write circuit, FIGS. 1 and 2 include embodiments 140, 240 of a buffer circuit, FIGS. 2 and 3 include embodiments 250, 350 of a dual clocked storage element. However, write circuits, buffer circuits, dual clocked storage elements and so forth are not limited to having the same design, and may be of different designs and include circuitry different from the circuitry in the respective embodiments illustrated in the figures.

As one example, although the dual clocked storage circuit 350 illustrated in FIG. 3 includes a distinct input stage circuit 352 and a distinct output stage circuit 354, in some embodiments of a dual clocked storage circuit 350, the input stage circuit 352 and the output stage circuit 354 may not be distinct, but may include overlapping elements. In still other embodiments, the input stage circuits 352 for a plurality of dual clocked storage circuits 350 may include overlapping elements, or the output stage circuits 354 for a plurality of dual clocked storage circuits 350 may include overlapping elements.

Also, although FIGS. 1 and 2 illustrate the output clock signal OUT-CLK being provided responsive to an output of a write command circuit 114, 214, in some embodiments, the output clock OUT-CLK may be provided responsive to a delay circuit that includes both a command decode mock delay circuit and a write command mock delay circuit.

In still another variation, although each of the DQ and DW signal lines illustrated in the figures is only one bit wide, in other embodiments, one or both of the DQ and/or DW lines may be several bits wide. In embodiments where only one of the DQ and DW lines are several bits wide, the write circuit may function as an interface between a system clock CLK and a data input clock DK with different operating frequencies.

In yet another embodiment, rather than coupling the outputs of the dual clocked storage circuits 250 together as illustrated in FIG. 2, the outputs may be provided to a multiplexer, and the OUT-CLK signal may be provided as the select signal for the multiplexer.

Accordingly, the invention is not limited except as by the appended claims.

What is claimed is:

1. An apparatus, comprising:
   an input control circuit configured to provide an input clock signal responsive to a data clock signal;
   a delay circuit configured to delay the data clock signal corresponding to a propagation delay of a write command signal to provide a delayed data clock signal;
   an output control circuit configured to provide an output clock signal responsive to a data write clock signal, the data write clock signal based on the delayed data clock signal; and
   a buffer circuit configured to capture data responsive to the data clock signal and the input clock signal, the buffer circuit further configured to provide the captured data responsive to the data write clock signal and the output clock signal.

2. The apparatus of claim 1, wherein the buffer circuit comprises:
   an input circuit configured to latch the data responsive to the data clock signal;
   a dual clocked storage element coupled to the input circuit and configured to latch the data responsive to the input clock signal; and
   an output circuit coupled to the dual clocked storage element and configured to latch the data responsive to the output clock signal.

3. The apparatus of claim 1, wherein the buffer circuit comprises a plurality of dual clocked storage elements.

4. The apparatus of claim 3, wherein the data clock signal is a continuously running clock signal and the buffer circuit continuously captures data responsive to the input clock signal and continuously provides captured data responsive to the output clock signal.

5. The apparatus of claim 3, wherein the input control circuit comprises a counter, and provides the input clock signal as a plurality of one-hot signals, each one-hot signal corresponding to each of the respective dual clocked storage elements.

6. The apparatus of claim 1, further comprising a command decode circuit configured to receive a command signal and provide the write command signal having the propagation delay, the command decode circuit physically located away from the input circuit.

7. The apparatus of claim 6, wherein the propagation delay of the write command signal is longer than an operating period of the apparatus.

8. The apparatus of claim 1, further comprising a write command circuit configured to receive the delayed clock signal and the write command signal and, in response, provide a write signal.

9. The apparatus of claim 8, wherein the write command circuit provides the data write clock signal to the output control circuit.

10. The apparatus of claim 8, wherein the command signal is a write command.

11. An integrated circuit, comprising:
    a first circuit configured to receive a first input signal and a first clock signal; and
    a second circuit configured to receive a second input signal and a second clock signal, and further configured to provide a third signal to the first circuit responsive to the second input signal and the second clock signal;

wherein the first circuit includes a buffer circuit configured to capture the first input signal responsive to the first clock signal and input clock signal that is based on the first clock signal and provide the captured first input signal responsive to at least a data write clock signal that is based on the delayed clock signal.

12. The integrated circuit of claim 11, wherein the first clock signal is a data clock signal and the second clock signal is a system clock signal.

13. The integrated circuit of claim 11, wherein the first and second clock signals have the same frequency.

14. The integrated circuit of claim 11, wherein the first circuit is a write circuit, and the second circuit is a command decode circuit.

15. The integrated circuit of claim 11, wherein the third signal is a write command signal.

16. The integrated circuit of claim 11, wherein the first circuit comprises an input control circuit that generates the input clock signal responsive to the first clock signal and also comprises an output control circuit that generates an output clock signal responsive to the delayed clock signal.

17. The integrated circuit of claim 11, wherein the buffer comprises an input stage configured to receive the first input signal responsive to the first clock signal and an output stage configured to provide the captured first input signal responsive to the delayed clock signal.

18. The integrated circuit of claim 11, wherein the buffer comprises a dual clocked storage element configured to receive the first input signal responsive to the first clock signal and further configured to provide the captured first input signal responsive to the delayed clock signal.

19. The integrated circuit of claim 18, wherein the buffer comprises a plurality of dual clocked storage elements and the first clock signal comprises a plurality of phases, each of the dual clocked storage elements configured to receive the first input signal responsive to a respective one of the plurality of phases of the first clock signal.

20. The integrated circuit of claim 18, wherein the dual clocked storage element is a first-in-first-out circuit.

21. The integrated circuit of claim 11, wherein the first circuit comprises a plurality of buffer circuits, and each respective buffer circuit corresponds to a respective data input line of a memory.

22. A method, comprising:
capturing data at a buffer responsive to an input clock signal and a data clock signal, the input clock signal derived from the data clock signal;
capturing a command responsive to a system clock signal;
propagating the captured command to a circuit as a write command the propagation of the write command to the circuit incurring a propagation delay;
delaying the data clock signal to match the propagation delay of the write command to provide a delayed data clock signal; and
synchronously providing the captured data and the captured command responsive to said delaying, the captured data provided by the buffer responsive to a data write clock and an output clock signal, wherein the data write clock is based at least in part on the delayed data clock signal and the write command, and the output clock signal is based at least in part on the data write clock.

23. The method of claim 22, further comprising capturing a third data from the first input line before the captured first data is provided.

24. The method of claim 22, wherein the propagation delay includes a processing delay and a travel-time delay.

25. The method of claim 22, wherein the first data includes data to be stored in a memory array and the second data is a write command, further comprising storing the captured first data in a write bank of the memory responsive to the captured second data.

26. A method, comprising:
storing a first data in a buffer of a first circuit responsive to a data clock signal and an input clock signal derived from the data clock signal; and
outputting the first data from the buffer responsive to a data write clock signal and an output clock signal derived from the data write clock signal;
wherein the data write clock signal is provided by delaying the data clock signal based on a propagation delay of a write command signal provided to the first circuit, and wherein the data write clock signal is based at least in part on the delayed data clock signal and the write command.

27. The method of claim 26, wherein the buffer synchronizes the outputted first data with the third signal.

28. The method of claim 27, further comprising outputting a write bank signal responsive to the delayed clock signal and the third signal.

29. The method of claim 26, further comprising storing a second data in the buffer responsive to the input clock signal.

30. The method of claim 26 wherein the data clock signal constantly transitions and the buffer constantly stores data and outputs data responsive thereto.

* * * * *